United States Patent [19]

Yamawaki et al.

[11] 4,147,432

[45] Apr. 3, 1979

[54] APPARATUS FOR THERMAL DIFFUSION BY HIGH FREQUENCY INDUCTION HEATING OF SEMICONDUCTOR SUBSTRATES

[75] Inventors: Masao Yamawaki, Handa; Katsuo Aoki, Aichi; Yoshio Oka, Toyota; Takao Suzuki, Kariya; Masahiko Amano, Handa; Hideki Ozaki, Gamagori; Osamu Ishihara, Toyota, all of Japan

[73] Assignee: Nippondenso Co., Ltd., Kariya, Japan

[21] Appl. No.: 744,049

[22] Filed: Nov. 22, 1976

[30] Foreign Application Priority Data

Nov. 26, 1975 [JP] Japan ................................. 50-141788

[51] Int. Cl.² ............................................. C23C 13/08
[52] U.S. Cl. .................................... 118/49.1; 118/500; 432/126; 432/239
[58] Field of Search ................. 118/48, 49, 49.1, 49.5, 118/500; 427/248 R, 248 E, 248 G, 251, 255, 86; 148/189, 186; 214/1 BB, 152; 432/126, 239, 253

[56] References Cited

U.S. PATENT DOCUMENTS

| | | | |
|---|---|---|---|
| 3,051,811 | 8/1962 | Koesling | 432/126 X |
| 3,202,406 | 8/1965 | Tack | 432/239 |
| 3,226,254 | 12/1965 | Reuschel | 118/49.5 X |
| 3,473,510 | 10/1969 | Sheng et al. | 148/189 X |
| 3,645,545 | 2/1972 | Garnache et al. | 118/49 |
| 3,710,757 | 1/1973 | Porter | 118/48 |
| 3,749,383 | 7/1973 | Voigt et al. | 118/49 |
| 3,765,763 | 10/1973 | Nygaard | 118/48 |
| 3,811,825 | 5/1974 | Enderlein | 432/253 X |

FOREIGN PATENT DOCUMENTS 626246 7/1949 United Kingdom ...................... 118/49

*Primary Examiner*—Mervin Stein
*Attorney, Agent, or Firm*—Cushman, Darby & Cushman

[57] ABSTRACT

This invention relates to an apparatus for thermal diffusion by means of high frequency induction heating suitable for mass production of semiconductor substrates of uniform quality; wherein a plurality of heating bases, each made of a material having good electric conductivity, and carrying semiconductor substrates, are continuously fed through a furnace tube where the bases are heated by means of high frequency wave excitation in order that each semiconductor substrate receives substantially the same thermal treatment.

11 Claims, 54 Drawing Figures

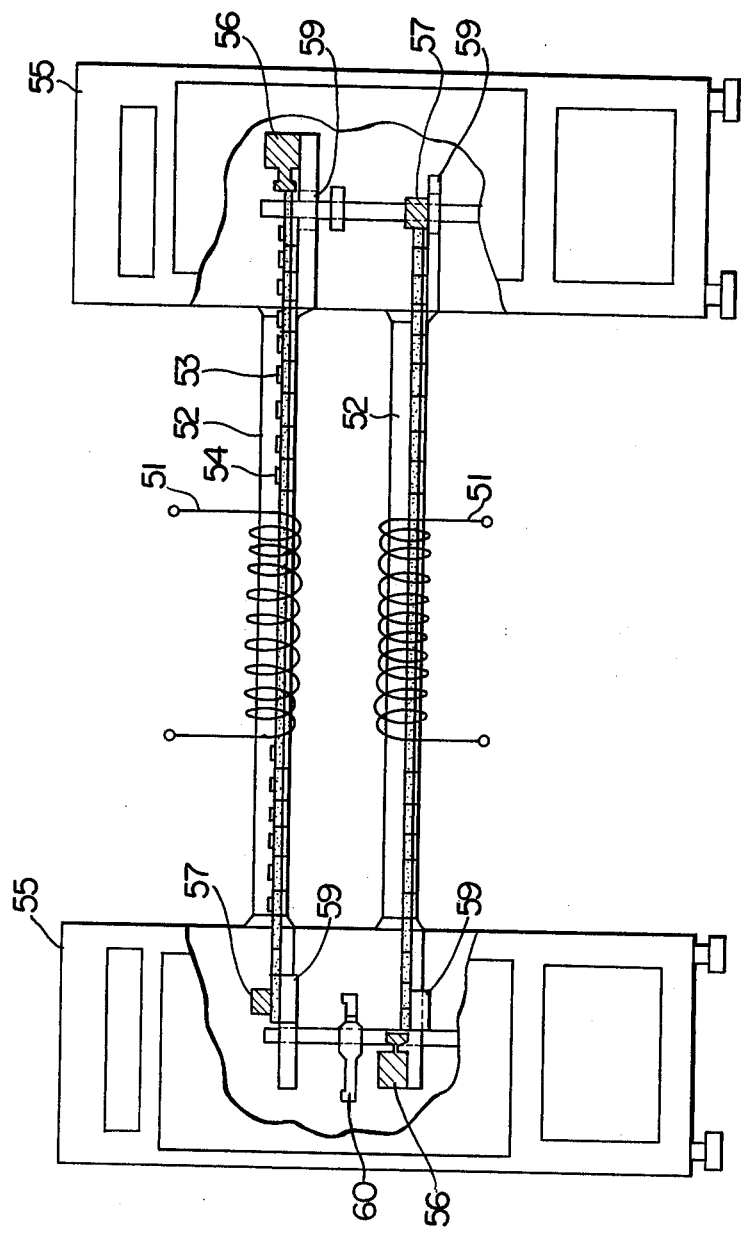

FIG.11a
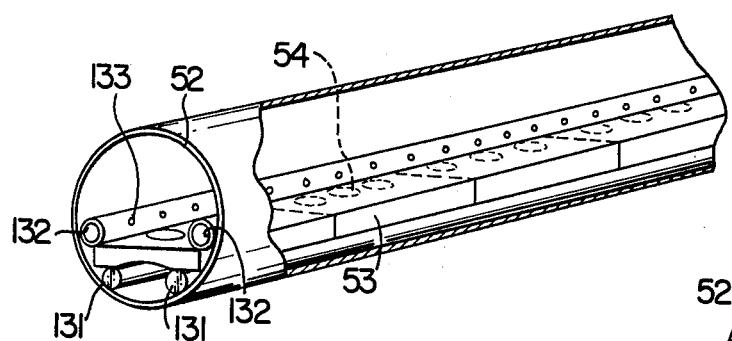
FIG.11b
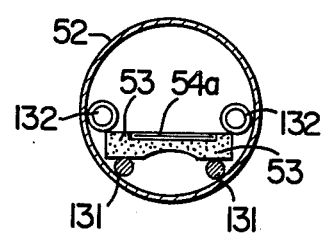
FIG.12a
FIG.12b
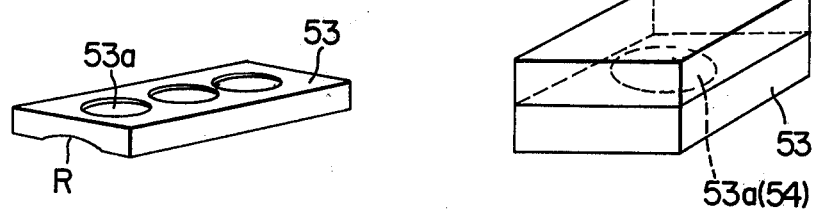

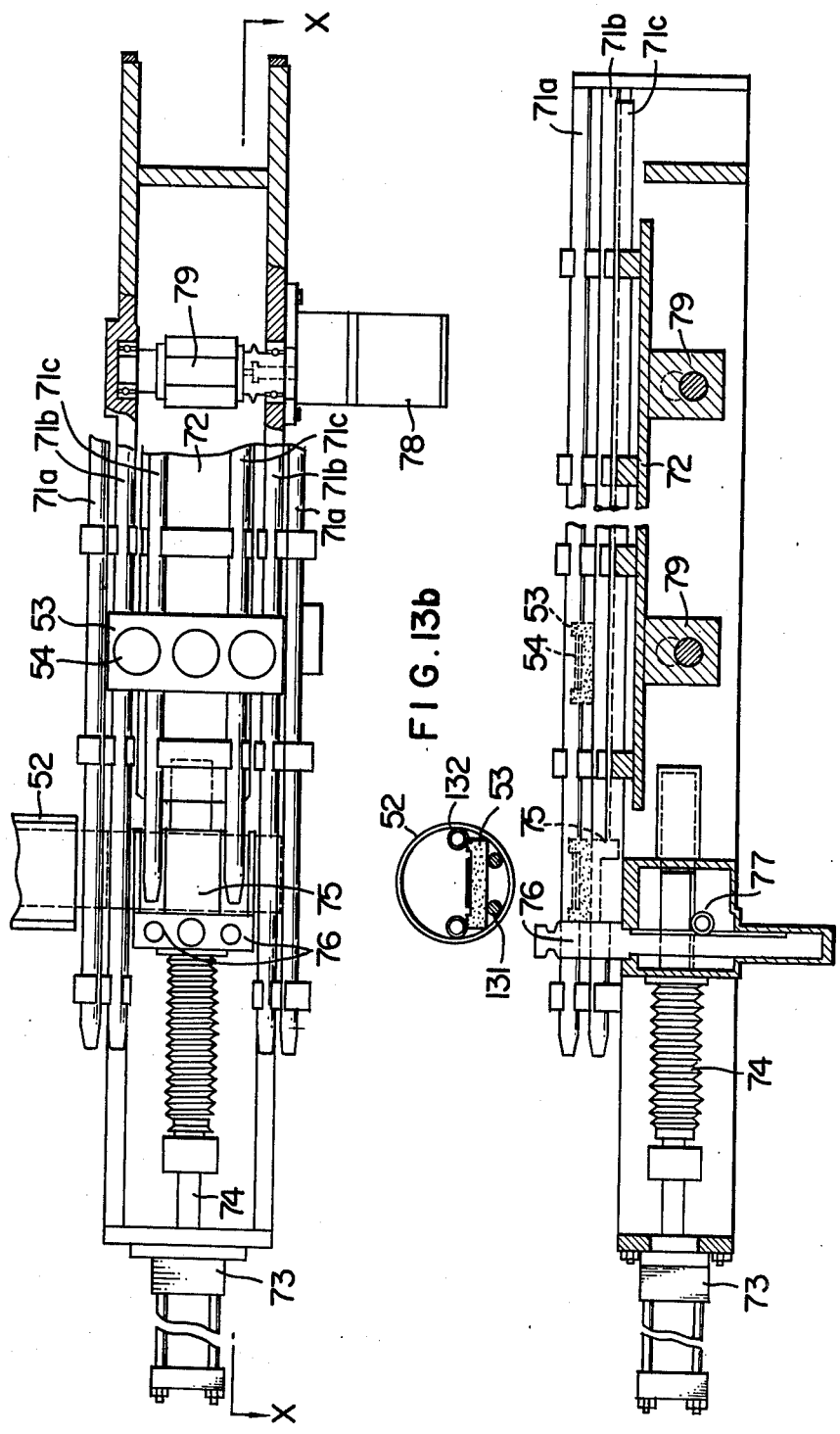

FIG.16d

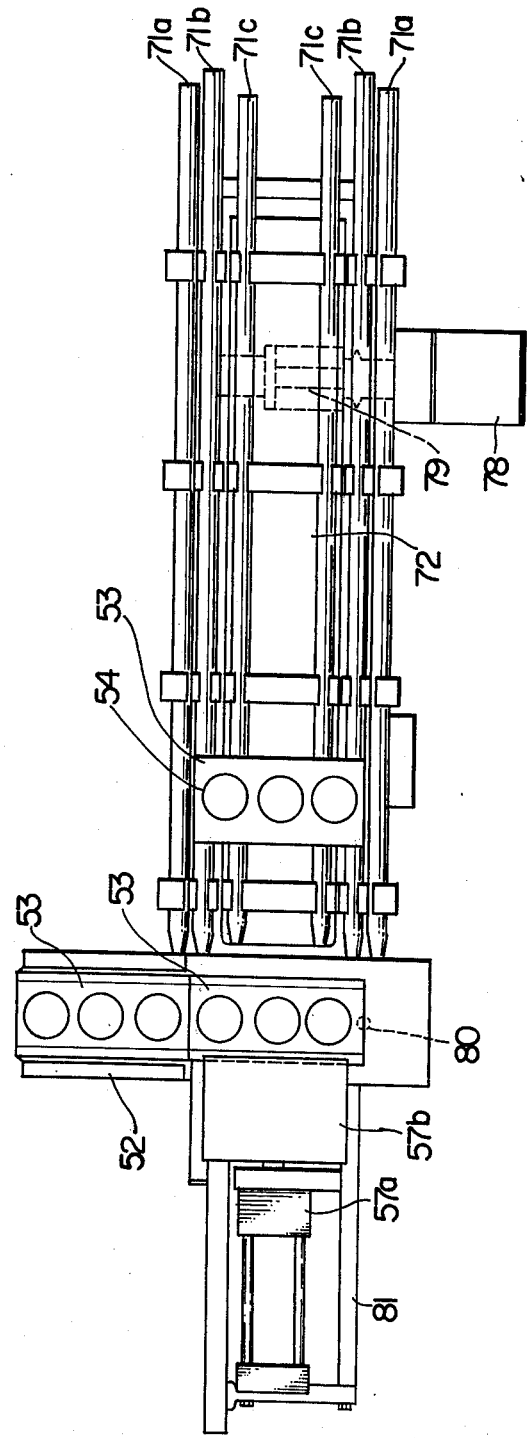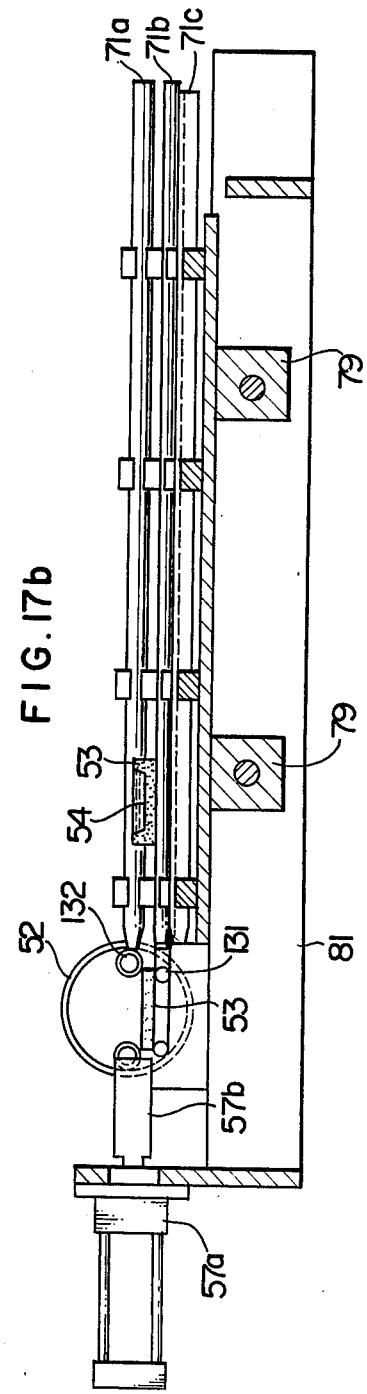

APPARATUS FOR THERMAL DIFFUSION BY HIGH FREQUENCY INDUCTION HEATING OF SEMICONDUCTOR SUBSTRATES

BRIEF SUMMARY OF THE INVENTION

The present invention relates to an apparatus for fabricating semiconductor devices having uniform quality suitable for mass production.

It is well known that in the process of fabricating semiconductor devices, such as diodes, transistors and the like by doping various impurity elements into substrates of a silicon semiconductor or the like, the thermal diffusion process in which the impurities are thermally diffused into the substrates, has been mostly widely employed.

In the prior art which has been commonly used for carrying out the said thermal diffusion, a plurality of the semiconductor substrates are placed at a predetermined position in a furnace tube made of quartz or the like which is extended through the axial space of an electric furnace or the like and being controlled with a high degree of accuracy to minimize temperature variation in the furnace and they are kept there for a required length of time at a set temperature for diffusion.

In usual practice, the substrates are arrayed on a base, hereafter referred to as a boat, made of quartz or graphite and inserted into the said furnace tube to be placed in a predetermined position. After being kept for a predetermined diffusion time, the boat is taken out of the furnace when the thermal diffusion is completed. The electrical characteristics of semiconductor devices such as diodes, transistor and the like fabricated by diffusion of impurities into semiconductor crystal substrates are, in general, greatly influenced by the concentration and the depth of penetration of the impurities into the substrates, which in turn are dependent upon the temperature of the diffusion atmosphere in which the substrates are placed. Therefore unless the diffusion temperature is controlled very accurately, the semiconductor devices of uniform electrical characteristics cannot be obtained. The fabrication of semiconductor devices, in general, requires the temperature control with an accuracy with a $\pm 0.5°$ C. of a setting temperature. When the number of semiconductor substrates to be inserted into a furnace tube is increased, the length of a controlled space must be increased accordingly. However, when the volume or space which may be effectively used in practice for diffusion is considered from the design aspects of the construction of a heater and a control system, the increase in length of a diffusion zone is not economical, as it enevitably results in a large size diffusion apparatus with high construction and operating costs, and consequently the increased manufacturing cost of a semiconductor device.

The electrical characteristics of semiconductor devices fabricated by thermal diffusion are greatly dependent not only on the concentration and depth of penetration of impurities but also on the crystal structures of the semiconductor substrates. For instance, when the concentration and penetration depth are the same but the speed with which the semiconductor substrates are inserted into and withdrawn out of a high temperature furnace tube or diffusion zone is different, thermal shock exerted to each substrate may differ, thus resulting in a difference in crystal structure, and consequently a difference in electrical characteristic from one semiconductor device to the other. In the fabrication of well known planar semiconductor devices, the residual stress distribution at the interface between an oxide film and a semiconductor crystal varies depending upon the speed of insertion into and withdrawal out of the high temperature diffusion zone. As a result, the variation in electrical characteristics from one batch to the other occurs with the resultant considerable decrease in yield rate.

As described above, with the prior art, not only the variation in electrical characteristics among the semiconductor substrates in each lot or batch due to the unstable temperature and atmosphere distribution or gradient within the furnace tube or diffusion zone but also the variation in electrical characteristics among the lots or batches due to the difference in operating conditions including the condition under which each batch is inserted into and withdrawn out of the furnace tube or diffusion zone cannot be eliminated or minimized. Many attempts and efforts have been made to overcome these problems but so far no satisfactory means has been proposed yet. The thermal diffusion process for semiconductor substrates consists primarily of three steps: cleaning, drying and diffusion. While apparatus that carry out the cleaning and drying steps automatically have been introduced recently, the diffusion step still remains a batch operation, which stands in the way of the full automation of the thermal diffusion process, hampering the large-scale mass production of semiconductor devices.

It is well known that the elevation of the temperature of the atmosphere in the diffusion tube can reduce by exponential function the time required for the diffusion treatment of semiconductor substrates, though great elevation of the temperature has not been possible because of the difficulty of controlling the temperature as described above and of the problem that may arise from the bending of the diffusion tube, which generally occurs in quartz, at a high temperature. For instance, the diffusion treatment time required for the penetraton of impurities into semiconductor substrates to a depth of 24 $\mu$ is theoretically 72 hours at the diffusion temperature of 1200° C., 12 hours at 1280° C. and 5 hours at 1350° C. This means, if a diffusion process and apparatus that would enable the diffusion treatment at an extreme high temperature and satisfy the requirement of electrical characteristics of semiconductor devices is provided, extremely effective mass production can be expected.

In view of the above, the object of this invention is to provide an apparatus for thermal diffusion treatment of semiconductor substrates by means of high frequency induction heating which enables a mass production of semiconductor substrates with a minimum variation in characteristics from one to the other, by setting up a plurality of heating bases, each made of a good electrical conductor and adapted to carry semiconductor substrates to be continuously transported in line through a thermal diffusion or furnace tube in which the heating bases are heated by means of high frequency oscillation so that each semiconductor substrates may have substantially the same thermal history, and a continuous thermal diffusion treatment of semiconductor substrates at an extreme high temperature can be made.

The present invention will become more apparent from the following description of one preferred embodiment taken thereof in conjunction with the accompanying drawings.

BRIEF DESCRIPTION OF THE DRAWINGS

FIG. 9 is a partial sectional front views, illustrating the second embodiment of this invention;

FIG. 11(a) and 11(b) are a perspective view and a traverse sectional view respectively, showing the state of transfer of heating bases through a quartz tube;

FIG. 12(a) is a perspective view of a heating base, provided with a curvature R;

FIG. 12(b) is a perspective view of a heating base provided with a closure;

FIG. 13(a) is a partial sectional top view of a transfer device for transporting the heating bases to the inlet end of the quartz tube;

FIG. 13(b) is a sectional view thereof, taken along the line X—X of FIG. 13(a);

FIGS. 16(a), 16(b), 16(c), 16(d), 16(e) and 16(f) are a schematic view used for the explanation of the mode of operation of the pusher device shown in FIG. 15(a), (b) and (c);

FIG. 17(a) is a top view of a take-out device for taking out the heating bases;

FIG. 17(b) is a sectional front view thereof;

DETAILED DESCRIPTION

Figure 1:
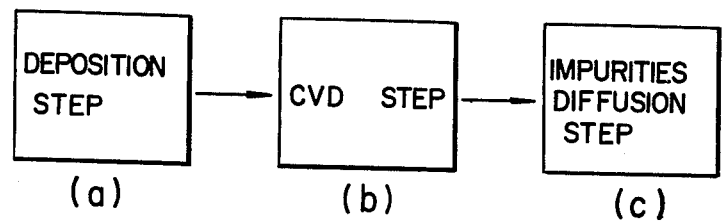
FIG. 1 is a flow chart that illustrates a pre-process for carrying out the diffusion process in accordance with the present invention.

The present invention is further explained with reference to the examples shown in the drawings. FIG. 1 shows a pre-process for carrying out the diffusion in accordance with the present invention. As described elsewhere in the above, the oxide film coating to form a silicon oxide film over the surfaces of wafers have been done concurrently with the process for diffusion of impurities, by introducing oxygen gas (hereafter referred to as $O_2$ gas) into the diffusion or furnace tube. The process in accordance with this invention, however, does not allow such a concurrent treatment, as $O_2$ gas reacts on silicon carbide with which the heating bases made of graphite is coated and shortens the life of the heating bases considerably. The oxide film coating, therefore, is carried out as a pretreatment of C.V.D. (Chemical vaper deposition) in the C.V.D. step after a well known deposition step (a) as shown in FIG. 1 has been finished. Then in the diffusion step (c) a nitrogen gas (hereafter referred to as $N_2$ gas) is used as an inert gas.

Figure 2A:
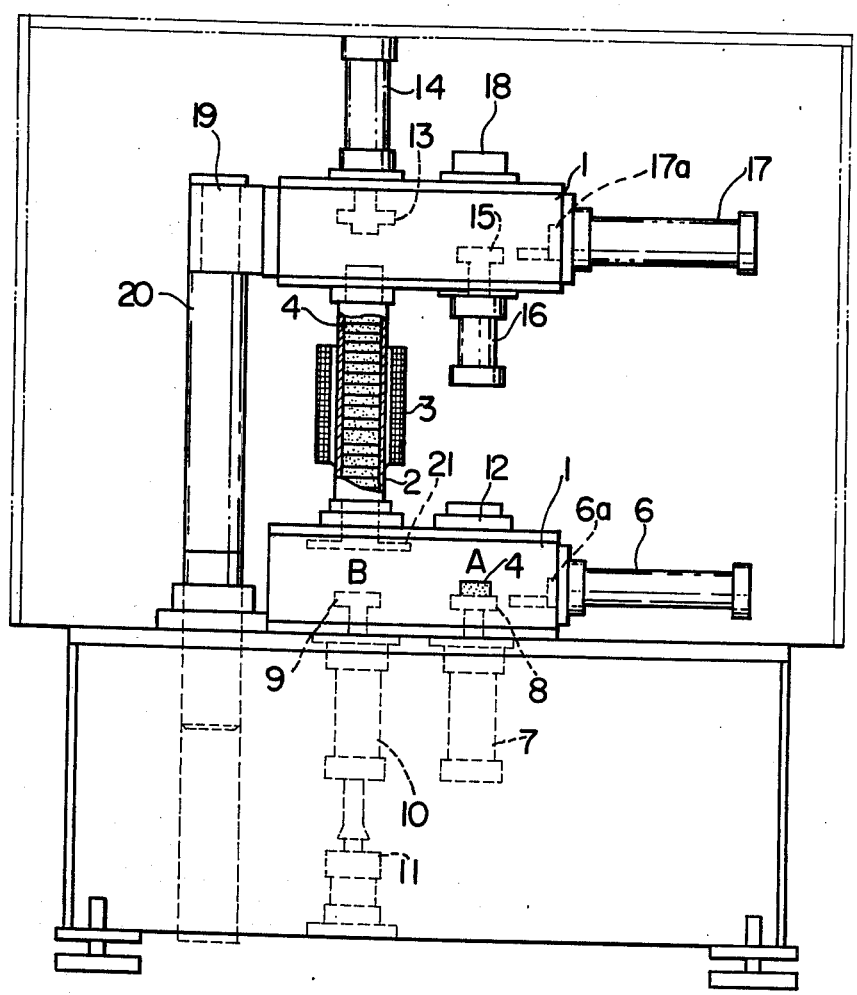
FIG. 2(a) is a front view illustrating the first embodiment of this invention.
Figure 2B:
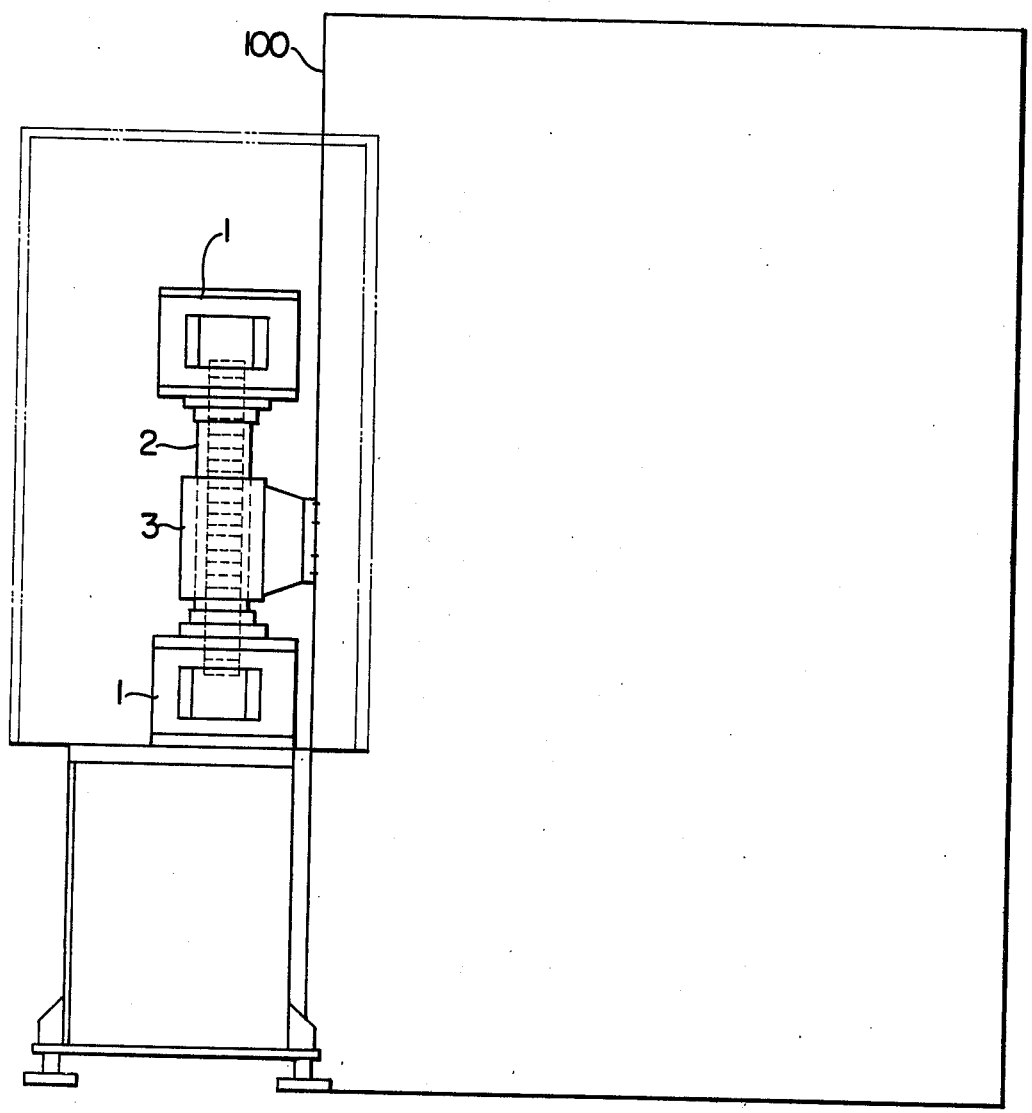
FIG. 2(b) is a side view thereof.
Figure 4A:
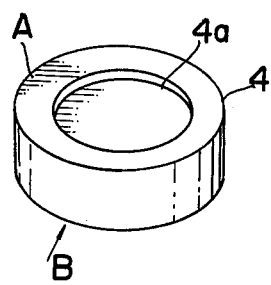
FIG. 4(a) is a perspective view of a heating base.
Figure 4B:
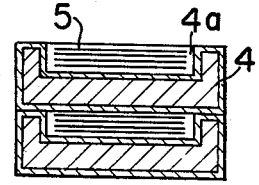
FIG. 4(b) is a longitudinal sectional view which shows the state in which one heating tube is laid upon another.

FIG. 2a and FIG. 2b are schematic views illustrating a general construction of the thermal diffusion apparatus in accordance with the present invention. FIG. 2(a) is a front view thereof; and FIG. 2(b) is a side view thereof. In this drawing, the numerals 1 are extremely purified clean chambers isolated from the open air and filled with an inert gas; 2 is a diffusion or furnace tube made of quartz, which is heated by high frequency induction heating means provided by high frequency heating coil 3; 4 is a heating base to be passed through the quartz tube 2 and heated by high frequency heating coil 3. As shown in FIG. 4(a) and 4(b), the heating base is of a cylindrical shape, a wafer holding chamber 4a, the center recess capable of retaining a plurality of wafers 5. As it is desirable to be made of a material which has a good electrical conductivity and discharges little metallic ions at high temperature, the heating bases in this example are made of graphite and are coated with silicon carbide to give resistance to oxidation. The heating base is fed in from the inlet 12 in the state that the clean chamber 1 shut off from the outer atmosphere, is loaded on a receiving base 8 which is moved up and down by a shutter cylinder 7 and brought down to a predetermined position when a heating base transfer device 6 starts moving to transfer the heating base from point A to numeral B. That is, upon arrival of the heating base 4 at the position, a transfer bar 6a of the heating base transfer device 6 advances, picks up the heating base 4 on the receiving base 8 at the point A and transfers it onto a pusher base 9. The pusher base 9, which is moved up and down by a lowering cylinder 10 and a lifting cylinder 11, pushes up the heating base 4 on the pusher base 9 successively to the position of a clamper 21 where the inlet to the quartz tube 2 is. The number 13 is another clamper that takes out the heating base 4 discharged out of the quartz tube 2 and is actuated for its up-and-down movement by an air cylinder 14. The numeral 15 is a heating base take-out jig which takes out the heating base 4 from the clean chamber 1, and is controlled for its up-and-down movement to the outlet 18 by an air cylinder 16. The numeral 17 is a heating base transfer device which transfers with its transfer bar 17a the heating base 4 taken out by the clamper 13 to the position of the take-out jig 15. The numerals 19 and 20 are a movable shaft and a supporting shaft respectively that enable the device comprising the clean chamber 1 to move in vertical and longitudinal directions. The numeral 100 is a control box provided with a device to control the heating condition of high frequency induction heating coil 3.

Now the operation of the apparatus having the above structure is explained in detail. First, the first heating base 4, on which a plurality of wafers 5 are loaded at the inlet 12 under the condition that the clean chamber 1 is shut off from the open air outer atmosphere, is placed on the receiving base 8 of the shutter cylinder 7. Next the receiving base 8 comes down to a predetermined position and stops there. Then the transfer bar 6a of the heating base transfer device 6 advances and takes up the base 4 and transports it onto the pusher base 9. When the transportation of the first heating base is completed, the cylinder 10 for lowering starts an upward motion. When the pusher base 9, carrying the heating base 4 has come up, the heating base clamper 21 clamps the heating base. Then the pusher base 9 descends to the original position and wait for the arrival of next heating base 4. When the second heating base 4 arrives at the pusher base 9 in the same way as has been described above, the lowering cylinder 10 ascends and pushes up the second heating base 4 so that the top surface of the base comes in contact with the bottom of the first heating base 4, held by the heating base clamper 21, and under this state, the clamper 21 operates and unclamps the first heating base 4. Then the cylinder 11 for the work ascension operates and moves the first and second heating bases, in the state that the former is on the latter, by a distance equal to one thickness of the heating base through the quartz tube. Subsequently the clamper 21 clamps the second heating base and then the pusher base 9 descends. While the heating bases are successively fed into and transported through the quartz tube 2 in this way, the heating bases 4, each carrying a plurality of wafers 5, are excited by high frequency heating coil 3 connected to a high frequency oscillator and generates heat and accomplishes the thermal diffusion. Further, when each heating base 4 sent successively into the quartz tube 2 comes out in the clean chamber 1, after having passed all the distance of the quartz tube, each heating base is picked up by the clamper 13 actuated by the air cylinder 14 and is taken up by the transfer bar 17a of the transfer device 17 and transported onto the take-out jig 15 which then is pushed up by the air cylinder 16 to the outlet 18 where the take-out jig stops for discharge of the heating base 4.

As described briefly in the foregoing, one of the objects of this invention is to attain a better productivity than before by so arranging that the heating bases 4 carrying wafers 5 are transported in succession and each heating base is heated under the same conditions, both time-wise and temperature-wise all the way through the coil 3.

As this example of the embodiment of this invention shows, the thermal diffusion treatment of semiconductor devices in accordance with this invention can be broken into the following two processes and mechanisms:

(1) The first process and mechanism for the thermal diffusion wherein the heating bases made in graphite, each carrying a plurality of wafers are transported in succession without contamination or breakage to an inlet of a quartz tube of which outer periphery is surrounded with a high frequency induction heating coil for diffusion treatment of wafers and then a plurality of such heating bases that are fed to the inlet of the quartz tube continuously are transported through the quartz tube from the inlet to the outlet; and during the transportation through the tube, the heating bases excited by an induction heating coil connected to a high frequency oscillator generate heat and consequently a heat conduction from the heating bases give all the wafers the same thermal history.

(2) The second process and mechanisms, wherein the heating bases loaded with wafers are, after said bases having gone through a given quartz tube, transported from the outlet of said tube to a predetermined place and taken out successively one after the other without contaminator breakage of the wafers loaded on the bases during the whole process.

As explained in the preceeding, in order to carry out the thermal diffusion treatment of semiconductor devices at a high temperature exceeding 1200° C. and thereby to sharply cut down the time required for the diffusion, and yet to obtain a better layer in terms of uniformity, various ideas are incorporated into the apparatus under this invention, in addition to the above two mechanisms; for instance, the ideas for prevention of plastic deformation of the quartz tube and for prevention of the variations in the diffusion depth or the depth of penetration of the impurities into the wafers to be treated with the thermal diffusion, that is, an idea for the shape of the boat which is so designed that a uniform temperature distribution may be obtained, and such an idea as a control of the high frequency oscillator for its stabilization under the continuous operation for a long period of time with a feed-back of the temperature measured of the heating bases.

Figure 3A:
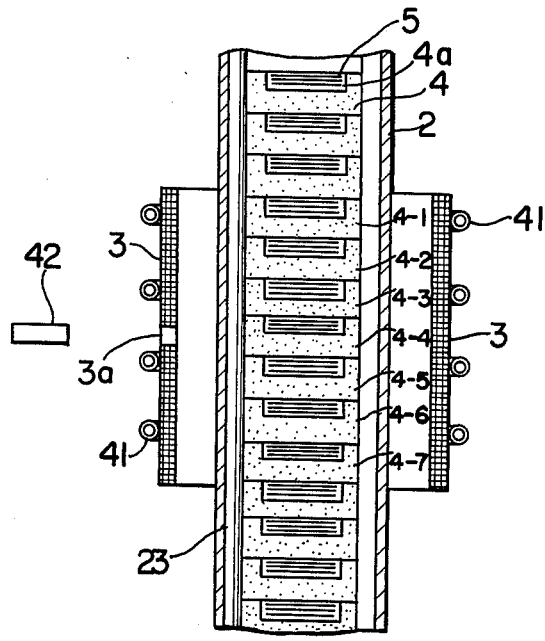
FIG. 3(a) is a longitudinal sectional view illustrating the state in which the heating bases are transferred through a quartz tube about the place where the induction heating coils are installed.
Figure 3C:
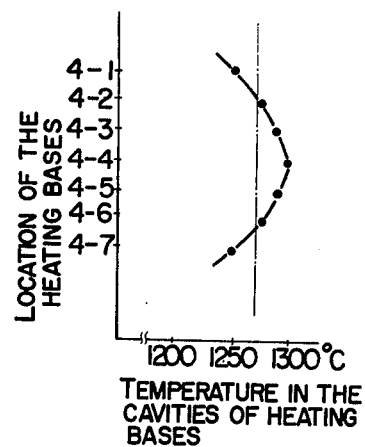
FIG. 3(c) is a view illustrating a temperature distribution or gradient over the heating bases.
Figure 3B:
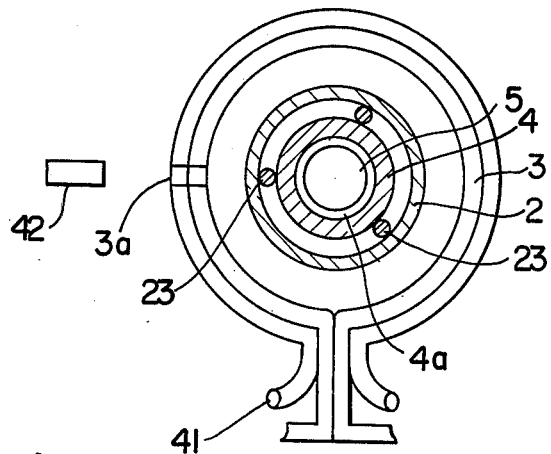
FIG. 3(b) is a traverse sectional view thereof.

Now these ideas are explained in detail below. FIG. 3a shows the status in which the heating bases 4 moves through the quartz tube 2. FIG. 3(a) is a longitudinal section view thereof and FIG. 3(b) is a traverse sectional view thereof. FIG. 3(c) is a distribution curve for the temperatures in recesses or cavities of all heating bases 4-1 through 4-7 within the area of the tube surrounded by the heating coil 3. Here, the induction heating coil 3 having a temperature measuring winow 3a is provided around the outer periphery of the quartz tube 2 as shown in FIG. 3(a). Inside the wall of quartz tube 2 are three guide rods 23 made of quartz glass to support the heating bases 4 at three points so as the heating bases 4 may not move off the center line of the coil 3 as they move through the quartz tube, each carrying a plurality of wafers in its cavity or holding chamber 4a. Further, cooling pipes 41 are attached around the outer periphery of coil 3 and cooling water is run through the pipes to prevent plastic deformation of the quartz tube at the high temperature. It is also so designed that quartz tube 2 is cooled by sending air into the space between the coil 3 and quartz tube 2. Further, with the provision of a temperature measuring window 3a in the center of coil 3, temperature is measured by an optical pyrometer. The measured values are fed back to the high frequency oscillator for overcoming the instability of the oscillator under continuous operation.

Next, the inventive point in this process for the prevention of the variations in the diffusion depth or the depth of penetration of impurities into the wafer to be treated with the thermal diffusion is described. This is a point important for carrying out the continuous thermal diffusion employed by this process. According to this process and apparatus, a uniform penetration depth into the wafers is aimed at being obtained by giving the same thermal treatment to each wafer by transporting the heating bases carrying the wafers through the quartz tube surrounded by induction heating coil. As the diuffusion is executed at a very high temperature over approximately 1250° C., the depth of penetration into wafers is greatly influenced by the shape of a heating base, which therefore is particularly contrived. This will be explained with reference to FIG. 4a. FIG. 4(a) is a perspctive view of the heating base and FIG. 4(b) is a longitudinal sectional view of the heating bases as they are piled up. As shown in this drawing, the heating base has a columnar shape which is more convenient for a uniform distribution of heat. A cavity to match the size of the wafer is provided on the top surface which is the wafer holding chamber 4a in which a plurality of wafers can be inserted. The advantage of this shape is in that when the bases are piled up in a manner as shown in FIG. 4(b), the wafer holding chamber 4a is closed with the bottom of another base 4 on top, and thereby the temperature distribution in the wafer holding chamber 4a, that is, the distribution of heat generated from the heating base 4 by means of the high frequency excitation becomes adjustable for the better by selection of appropriate dimensions for the diameter and thickness of the base 4 and the depth of wafer holding chamber 4a, according to the diameter of wafer 5. As described already, a good electrical conductor which would discharge little metallic ions at high temperature is more desirable as a material for the heating base 4, and in this example, graphite is used. Here, graphite surace is coated with SiC for prevention of oxidation. When the heating bases are piled up as in this example, the side surfaces exposed to $N_2$ gas atmosphere have lower temperature. For instance, a measuring temperature in a test of the side surface was 1150° C. while that in the center of the wafer holding chamber 4a was 1300° C. This means that the required high temperature atmosphere can be relatively easily obtained with this setup. While the heating base 4, which is the object to be heated, is made of a good electrical conductor to make use of heat generation from eddy current loss of high frequency magnetic field to be impressed, the same effect may be obtained with an insulator if heat generation from dielectric loss of the high frequency electric field to be impressed is made available for this purpose.

Next, two major mechanisms which make up this apparatus and their mode of operation will be described in detail.

(1) The first is a mechanism with which the heating bases, each carrying a plurality of wafers in its holding chamber are firstly loaded on a jig disposed within a nitrogen gas atmosphere sealed from the open air and next transferred without contamination or breakage of the wafers to the inlet of a quartz tube, surrounded with induction heating coil for thermal diffusion, and then moved from the inlet to the outlet of the quartz tube.

Figure 5:
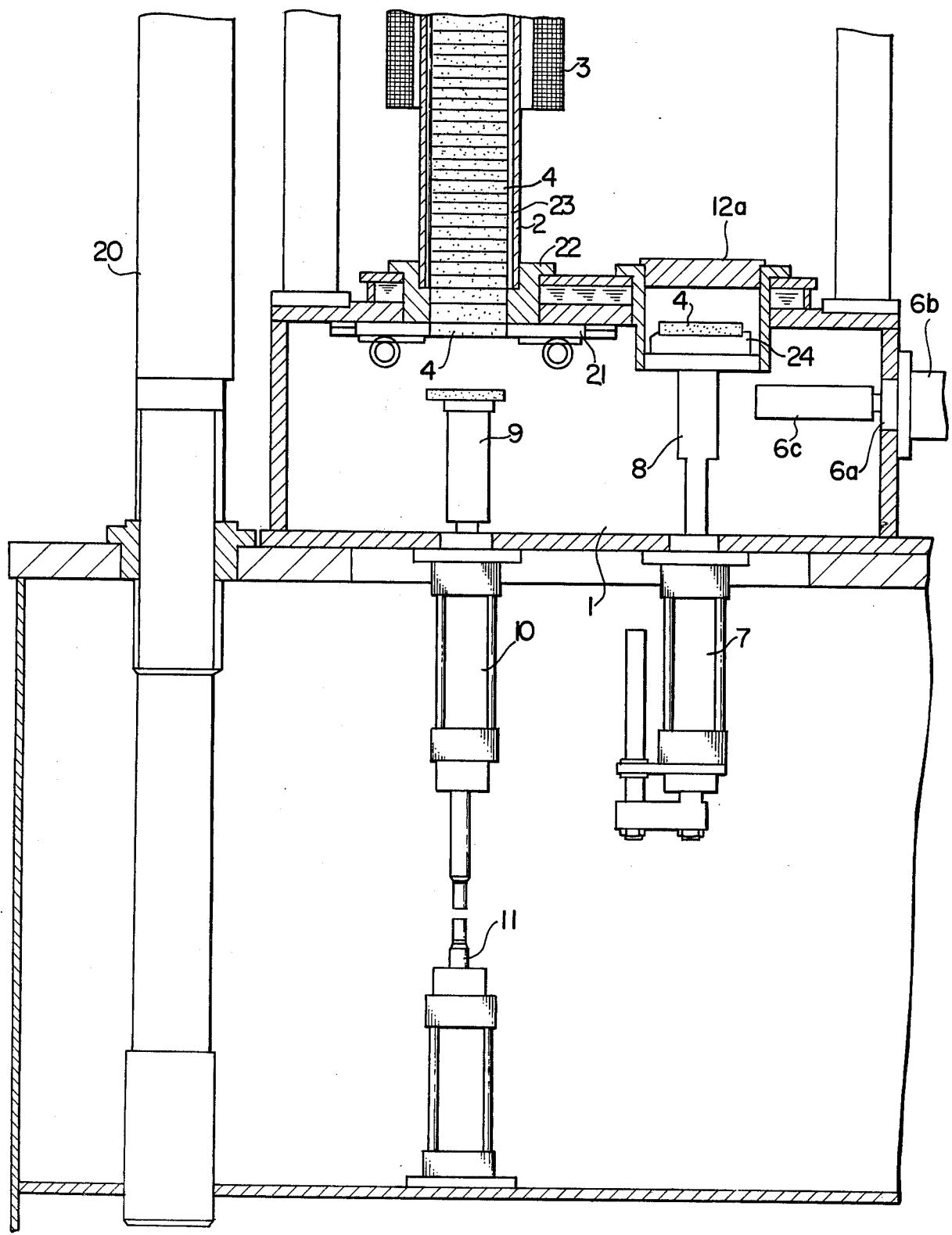
FIG. 5 is a sectional view, illustrating the transfer mechanism for feeding the heating bases into the quartz tube.

First, referring to FIG. 5, the above mentioned first mechanism will be explained. FIG. 5 is a sectional front view of the mechanism. A lid 12a on the entry port for the heating bases 4 shuts out the atmosphere and keep the clean chamber 1 filled with $N_2$ gas. When the base 8 for holding the heating base 4 is in the state of shutting out the atmosphere as shown in the drawing, the lid 12a opens to let in the heating base 4. The holding base 8 is actuated with shutter cylinder 7 for up-and-down movement. A locating claw 24 is provided for correct location of the heating base 4. In this apparatus, heating base 4 is manually fed, but it can be easily assumed that this step can be performed automated manner. Next, the heating base transfer device 6 which transfers the heating base 4 on holding base 8 to the position beneath the inlet end of quartz tube 2 consists of a cylinder 6b which moves in horizontal direction, a transfer bar 6a to be actuated by the cylinder 6b and a supporting base 6c attached to the forward end of the bar 6a. The heating base 4 is loaded on 6c for the transfer. Next, the heating base 4 placed on pusher base 9 is inserted successively into quartz tube 2 and the last heating base that becomes the bottom layer of the piled heating bases is always supported at its circumferential side with clamper 21. Now the mechanism with which a new heating base is fed into quartz tube is as follows; upon arrival of heating base 4 at the pusher base 9, escaping cylinder 10 acts and the heating base 4 on pusher base 9 is pushed up until it comes in touch with the last heating base held at the inlet end of quartz tube 2, and then the clamper 21 unclamps the heating base, leaving a whole weight of the heating bases now in quartz tube 2 on the pusher base 9, and under this state, the work lifting cylinder 11 operates and pushes up the whole heating bases by a distance equal to the thickness of one heating base, and in this state, clamper 21 clamps the circumferential side of the newly fed heating base 4 and holds the whole weight of the bases in the tube 2. Further, quartz tube 2 is sealed with seal ring 22, from the outer atmosphere and guide rods 23 are attached to the inside wall of quartz tube so that the pile of heating bases 4 may not get out of position.

Figure 6A:
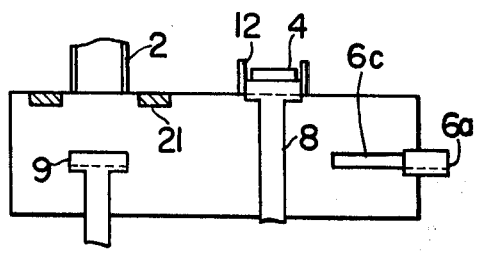
FIGS. 6(a), 6(b), 6(c), 6(d), 6(e), 6(f) and 6(g) are schematic views used for explanation of the mode of operation of the heating base transfer mechanism shown in FIG. 5.
Figure 6E:
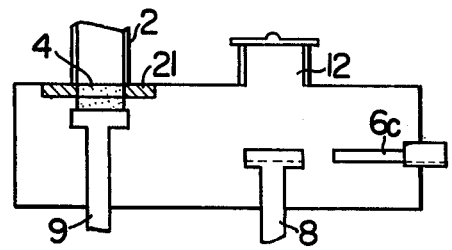
Figure 6B:
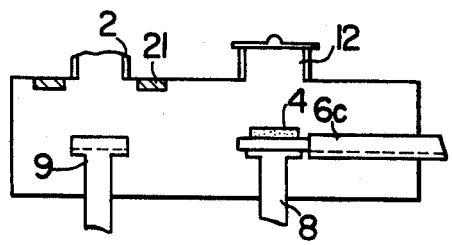
Figure 6F:
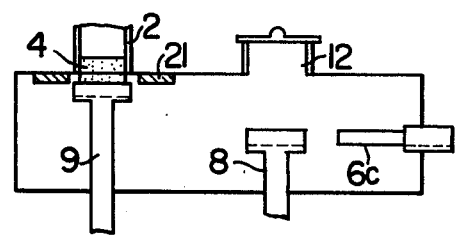
Figure 6C:
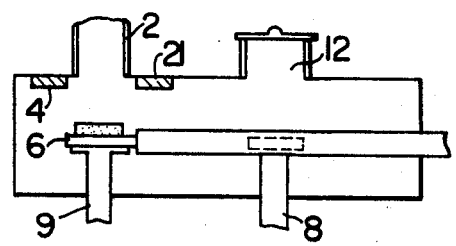
Figure 6G:
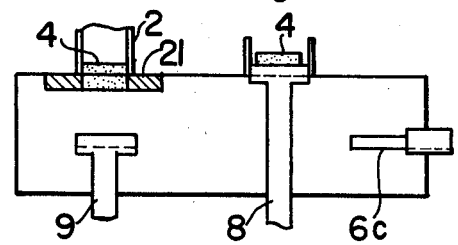
Figure 6D:
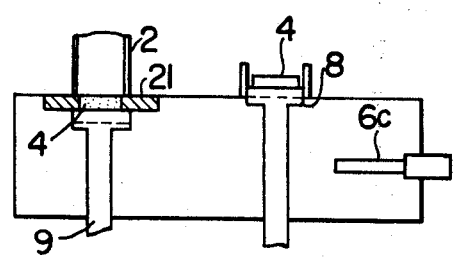
Figure 6H:
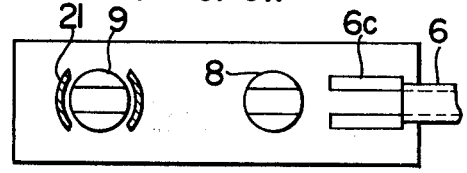
FIGS. 6(h) and 6(i) are a schematic view for explanation of the shapes of heating base transfer jigs shown in FIG. 6(a)
Figure 6I:
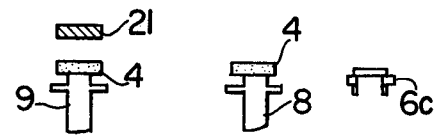

Next, the mode of operation of this mechanism is explained in detail with reference to FIGS. 6(a), 6(b), 6(c), 6(d), 6(e), 6(f) and 6(g) which are schematic front views, respectively. FIGS. 6(h) and 6(i) are a schematic front view and a schematic side view respectively, for better understanding of the shape of each jig. First, as shown in FIG. 6(a), the first heating base 4 is fed in from the entry port 12 and placed on the receiving base 8. When receiving base 8 has come down to a predetermined position, transfer bar 6a of transfer device 6 advances and takes up heating base 4 from the receiving base with supporting bar 6c at the forward end of the bar 6a (See FIG. 6(b).). With this shift operation completed, heating base transfer device further advances and transfers heating base 4 onto pusher base 9 positioned underneath quartz tube 2. See FIG. 6(c). Next when pusher base 9 has come up to the position of heating base clamper 21 as shown in FIG. 6(d), clamper 21 clamps and holds the circumferential side of heating base 4 during which period of time receiving base 8 ascends and the second heating base is placed. In this case too, as shown in FIG. 6(e) when the second heating base 4, after having gone through the same movement as depicted by the above described FIGS. 6(b), 6(c) and 6(d), arrives at the position where it comes in contact with the first heating base 4, clamper 21 unclamps and pusher 9 pushes heating bases 4 by a distance equal to one thickness of heating base 4 into quartz tube 2 as shown in FIG. 6(f). The clamper 21, then clamps the circumferential side of the second heating base and holds the first and second heating bases in the quartz tube (Refer to FIG. 6(g).). A continuous movement in this manner transfers the heating bases 4 successively through quartz tube.

(2) The second mechanism and step is to transfer successively the heating bases, which have passed through the quartz tube, carrying wafers, from the outlet end of the tube to a predetermined place and to take out successively one after the other without contamination or breakage of the wafers loaded in the holding chambers of the heating bases.

Figure 7:
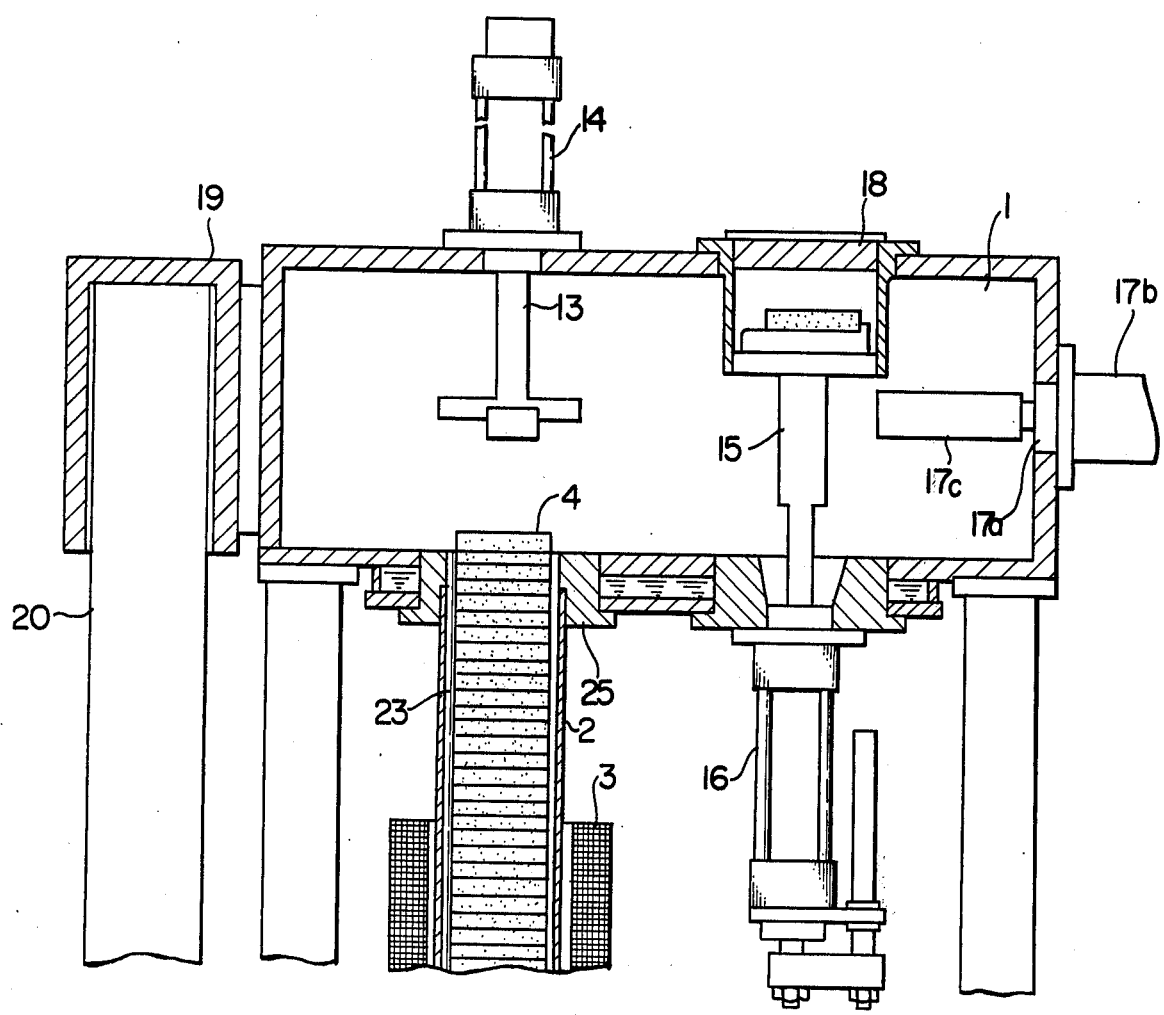
FIG. 7 is a sectional view, illustrating the mechanism for taking out the heating bases discharged out of the quartz tube.
Figure 8A:
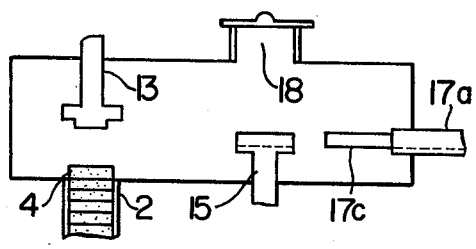
FIGS. 8(a), 8(b), 8(c), 8(d), 8(e) and 8(f) are schematic views used for explanation of the heating base take-out mechanism shown in FIG. 7.
Figure 8E:
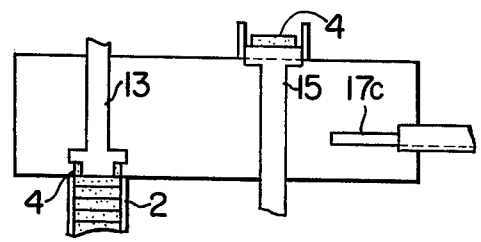
Figure 8B:
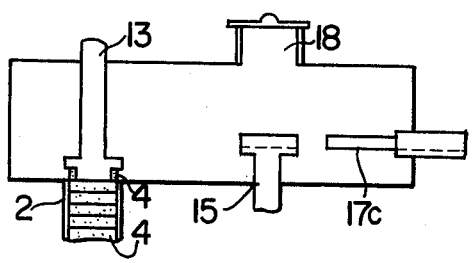
Figure 8F:
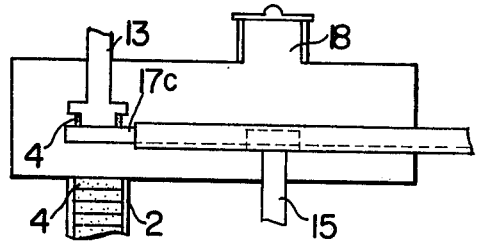
Figure 8C:
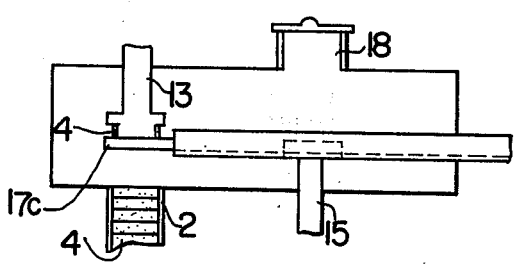
Figure 8G:
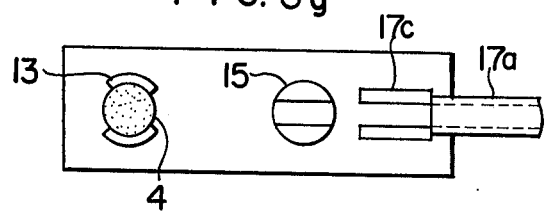
Figure 8D:
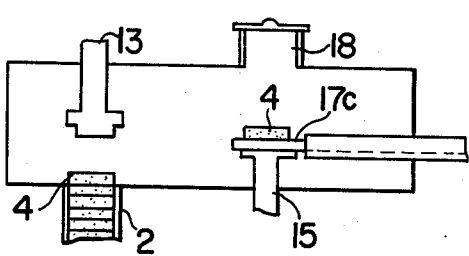
Figure 8H:
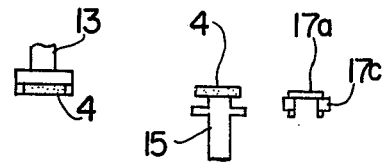

The explanation of the second mechanism will be made by first referring to FIG. 7 which is a sectional front view of the second mechanism. With the first mechanism, the first heating base 4 is heated by induction heating coil 3 provided outside the quartz tube 2 and exposes itself into clean chamber 1, after its passage through all the area of the quartz tube 2. The heating base clamp 13 is a device to separate the heating bases one by one as they come out after being transferred through the tube in stack. The heating base clamp 13 actuated by air cylinder 14 moves up and down and also operates for clamping and unclamping. The heating base transfer device 17 moves forward the transfer bar 17a by the action of air cylinder 17b, and receives the heating base 4 from clamp 13 and transfers it onto heating base take-out jig 15. This take-out jig 15 actuated by air cylinder 16 picks up the heating base 4 on supporting base 17c, which is a forward portion of transfer bar 17a moved by the transfer device, and moves it up for discharge from the take-out port 18. The numeral 25 is a sealing ring which insulate quartz tube 2 from the outside. Next, the mode of operation of this mechanism is explained in detail with reference to FIGS. 8(a), 8(b), 8(c), 8(d), 8(e) and 8(f) which are schematic front views illustrating the mode of operation of this mechanism. FIGS. 8(g) and 8(h) are a schematic top view and a schematic side view, respectively given for better understanding of each jig. FIG. 8(a) shows the state at the time when the first heating base 4 has arrived at the outlet of quartz tube 2 after its passage through all the length of quartz tube 2. Next, in the stage shown in FIG. 8(b), heating base clamper 13 descends and clamps the first heating base. Afterwards, the clamper 13 goes up and at the same time the heating base transfer device 17 operates and transfer bar 17a advances and receives the heating base from the clamp 13 with its support base 17a, as shown in FIG. 8(c). Then it transfers the heating base 4 from supporting base 17c of transfer device 17 to take-out jig 15, as shown in FIG. 8(d), thereupon the take-out jig 15 ascends and takes out the heating base 4 from the take-out port 18. At this moment, clamper 13 clamps the second heating base 4 (See FIG. 8(e).). In FIG. 8(f) the heating base transfer device 17 receives the heating base in the same way as shown in FIG. 8(c). In this way, this device repeats the operation and takes out the heating bases one after the other. The final take-out of the heating base from this apparatus is made manually, but can be easily automated. A test operation of this apparatus was made with an oscillation frequency of high frequency oscillator at 4 KHz, a graphite heating base 4 of 75 mm in diameter and 10 mm in thickness, a wafer loading chamber 4a of 50 mm in diameter and 1 mm in depth, a wafer 5 of 50 mm in outer diameter, five pieces of which being loaded in each holding chamber 4a, a coil of 100 mm in diameter and 160 mm in length, and a feed speed of heating bases at 10 mm/20 minutes. As the result, the wafers of which diffusion depths, or the depths of penetration of impurities into which falling within the range of 22–24 $\mu$m were obtained. The properties of the power transistors made of these wafers were good as well. And as for productivity, this apparatus greatly increased it as compared with that of the prior art.

Figure 10:
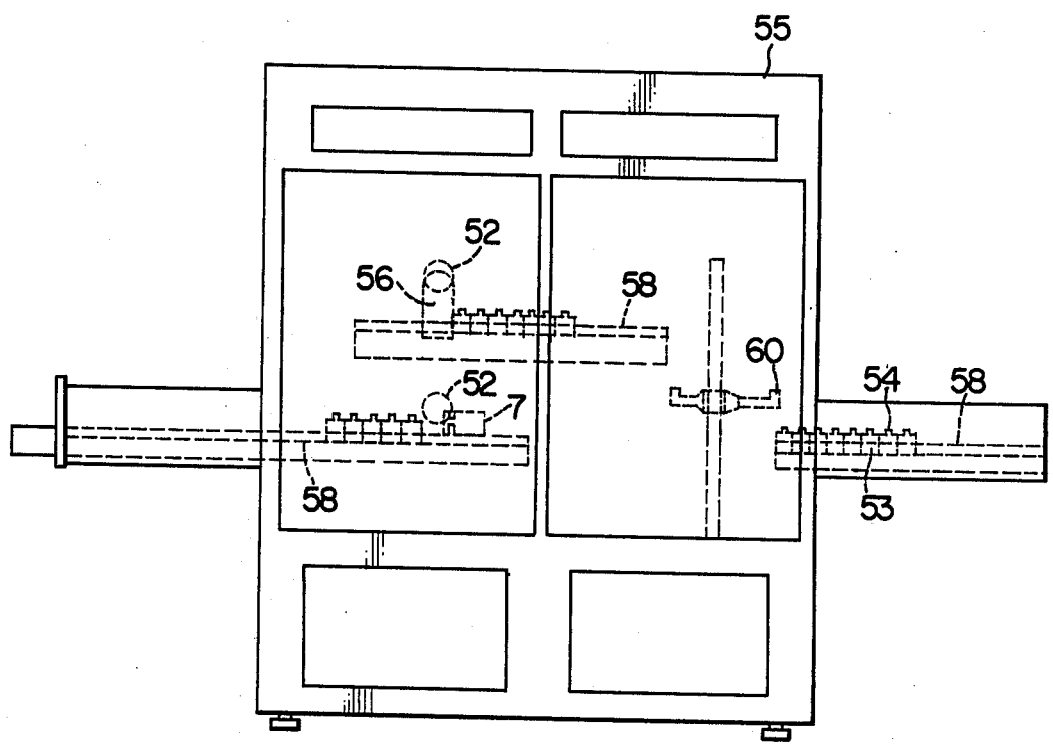
FIG. 10 is a side view of the apparatus shown in FIG. 9.

The thermal diffusion apparatus that has been described above must be kept very clean and for this purpose, the parts which the heating base 4 comes in touch with such as the holding bases of all transfer devices should be made of appropriate materials such as quartz, P.T.F.E., etc., and further these should be so constructed as to be removable as much as possible for cleaning. Also if the manner of the transportation of heating base 4 through the diffusion furnace, in this case, quartz tube 2 is so made that the heating base can be rotated as appropriate in addition to the mere push-in with the work lifting cylinder 11 as described above, more uniform thermal treatment to the wafers loaded on heating base 4 will be obtained. The process and apparatus shown with the first embodiment has a vertical type coil, inside of which a plurality of graphite-made heating bases of a columner shape are transported in pile and treated with induction heating to obtain a uniform heat-treatment to the wafers loaded in all the heating bases. The second embodiment of this invention has a horizontal type induction heating coil. A plurality of heating bases are continuously transferred through this coil. The following is the process and apparatus used for the second embodiment shown in the relative drawings. FIG. 9 and FIG. 10 a front view and a side view respectively of the second embodiment of this invention. In this drawing, numerals 51 are coils for high frequency induction heating, which are connected to a high frequency oscillator which is not shown here. The numeral 52 is a quartz tube to play the role of a diffusion furnace. The numeral 53 is a graphite-made heating base of which surface is coated with SiC. Wafer 54 is loaded on the heating base which is put to induction heating with the above-mentioned coil 51 for thermal diffusion of the wafer. The numeral 55 represents clean chambers, each enclosing a group of heating base transfer devices. These chambers intentionally form an inert gas atmosphere and are airtightly connected with quartz tube 52. The numeral 56 is a pushing device which pushes the heating base 53 as it arrives at a predetermined position into quartz tube 52 at a constant speed. The numeral 57 is a take-out device for taking out the heating base 53 discharged out of the quartz tube. The numeral 58 designates transfer devices for the successive transportation of heating bases 53 from either a predetermined position to the inlet of quartz tube 52 or the outlet of the tube to a predetermined position.

The mode of operation of the above structure is now described. First, graphite heating bases 53, carrying wafers 54 are lined up on the transfer device 58 to be fed successively into the quartz tube 52. With a start signal, the first heating base 53 moves to come in front of the pusher device that feeds heating bases into quartz tube 52 at a constant speed. Then the pusher device 56 pushes in the first heating base 53 after confirming the arrival of the heating base at a predetermined position. The pusher device 56 comprising a pulse motor pushes the first heating base 53 into quartz tube 52 by a predetermined distance. With this completed, the second heating base 53 is fed in front of pusher device 56 with transfer device 58 and is pushed into the quartz tube in the same way as described above. During this operation, the front end side surface of the second heating base is in touch with the rear end side surface of the first heating base. The heating bases 53 are successively fed into quartz tube 52 in this manner and when the first heating base 53 is brought out after its passage through all the length of quartz tube 2, it is recognized by the take-out device 57 which then operates and takes it out and lines it up on the stocker 59. The heating base 53 is lined up on the stocker 59 and is transported by loader 60 to the stocker 59 at the lower stage and is again transported through the lower quartz tube 52. This apparatus enables the thermal diffusion treatment over a long period of time and is adaptable, with a combination of a plurality of these apparatus, to any desired conditions of thermal diffusion. This, of course, may be consisted of one quartz tube 52 alone. For the embodiment of this diffusion process, various novel ideas or systems are incorporated in various portions of the devices shown in FIGS. 9 and 10.

The explanation on these points follows. FIGS. 11(a) and 11(b) are enlarged views, showing the manner of movement of heating bases 53 within quartz tube 52 in connection with FIG. 9. FIG. 11(a) is a perspective view and FIG. 11(b) is a side view. Rails 131 in quartz tube 52 are for supporting a plurality of heating bases 53 in their successive movement to advance in a fixed direction. The numeral 132 is a gas pipe for the supply of an inert gas, $N_2$ gas in this case, to maintain a uniform gas atmosphere. This pipe also have an additional role as a guide rail for preventing the heating base 53 from lifting or coming up. The pipe is provided with gas outlets 133 of which diameters are gradually enlarged so that the same amount of gas may flow out of each gas outlet. FIG. 11(b) shows the location of heating base 53 within quartz tube 52. With the arrangement described above, heating base 53 can smoothly move through the quartz tube. In order to maintain a uniform thermal history and thereby to obtain a uniform diffusion depth in wafers 54, heating base 53 to be loaded with wafers 54 is so constructed that the temperature distribution may be uniform within heating bases 53. The temperature decrease around the ends as compared with the temperature in the center can be avoided with the provision of curvature R at the bottom of the heating base 53 as shown in FIG. 11(a). The numeral 53a is a slot to match the size of wafer 54 for loading the same. A plurality of wafers 54 are loaded in this slot in which the wafers 54 are heated by means of heat conduction from the heating base 53 heated by induction heating. FIG. 12(b) is a schematic view showing the state in which wafers 54 are put between two pieces of heating bases like a sandwich. The thermal emission from the surface of heating base lessens under this state as compared with that at the time of the state shown in FIG. 12(a), and the effective heat for diffusion of wafers can be greatly increased with the same output power from the oscillator. While this embodiment is illustrated with the method in accordance with FIG. 12(b), either method is selected to suit the particular type of semiconductor devices to be produced. In order to specifically point out the advantages of the present invention over the prior art, a comparison is made below:

|  | Temperature | Diffusion thickness | Substrate processing capacity |
|---|---|---|---|
| Prior Art | 1200° C. | 7 μ (micron) | 1 |
| Present Invention | 1250° C. | 7 μ (micron) | 2 |

In the apparatus in accordance with the present invention as an example for test purposes, a heating base of a shape as shown in FIG. 12(a) and with the dimensions of 60 mm wide, 300 mm long, 10 mm thick and a 20 mm radius for curvature R was used and an induction heating coil of 110 mm $\phi \times 400$ mm, a high frequency oscillator, having an oscillation frequency of 110 KHz., $N_2$ gas to form a nitrogen atmosphere at a flow rate of 3 liter/minute were used. In the diffusion treatment according to a prior art, an oxide film over the surfaces of each wafer 4 is formed by supplying oxygen gas concurrent with the boron diffusion in the deposition step. In the process of the present invention, however, the wafers already coated with oxide film in the other previous step are used so that they are either stacked up or so-to-speak sandwiched for attaining higher efficiency of treatment.

Three basic mechanisms which constitute this invention are explained in detail hereafter.

(1) As described, the mechanism of this invention is adapted to successively transport a plurality of graphite heating bases, each carrying a predetermined number of wafers to be treated without causing any contamination or breakage thereof to the inlet or entrance of a predetermined quartz tube. The mechanism must meet the following requirements: (i) a member or portion which comes in contact with the heating base made of quartz or the like should be made of a corrosion-resistant material such as P.T.F.E., quartz glass, etc. that can be cleaned with fluoric acid or the like and at the same time so constructed as to be readily removable for cleaning for the prevention of contamination of wafers; (ii) the mechanism is made in such a construction as to permit the smooth transfer of heating base with the least frictional resistance at the time of the transfer so as the heating base made of graphite or the like may not be broken or worn off too quickly. The above-mentioned mechanism will be described in detail hereinafter with reference to FIGS. 13a and 13b. FIG. 13(a) is a top view thereof, and FIG. 13(b) is a sectional front view thereof, in which 71a is a guard bar made of P.T.F.E., or the like which prevents the heating base 53 from falling off; 72 is an oscillation type transfer device which is oscillated by the rotation of a motor 78 and with this oscillatory motions makes the heating base 53 advance by one block distance, and a plurality of these oscillation type transfer devices make up the transfer device 58. Guard bar 71a, supporting bars 71b for supporting heating base 53, and heating base transfer bars 71c attached to oscillation type transfer device 72 are readily removable for cleaning. The oscillation type transfer device for the continuous transfer of heating bases 3 works as follows: a motor 78 coupled with an eccentric cam mechanism 79 moves the transfer bar 71c over an arcuated path and makes it to repeat oscillatory motions with which the heating base is advanced little by little. When the heating base 53 is brought over to a lift 75 disposed at the inlet end of quartz tube 52, an air cylinder 73 operates and extends its gear shaft 74 in mesh with a gear 77 and lifts the shaft 76 engaged with the gear 77. As the result, the lift 75 attached to the shaft 76 carries up the heating base 53 to the loading position from which the heating base is inserted into the quartz tube 52 by pusher device 56.

Figure 14A:
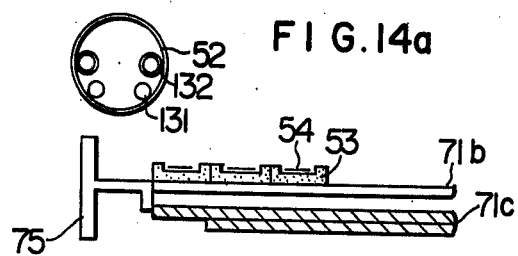
FIGS. 14(a), 14(b), 14(c), 14(d), and 14(e) are schematic views used for explanation of the mode of operation of the transfer device shown in FIG. 13(a) and (b)
Figure 14B:
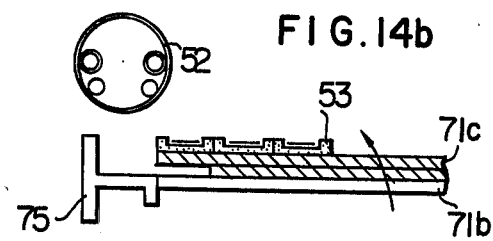
Figure 14C:
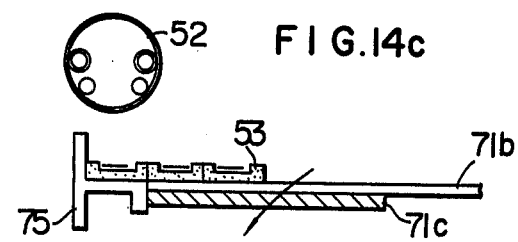
Figure 14D:
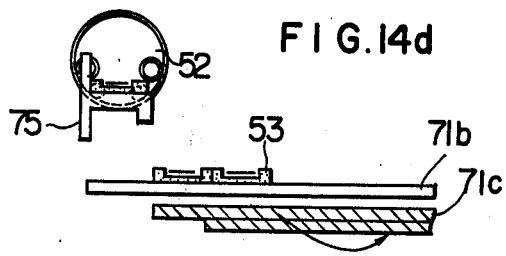
Figure 14E:
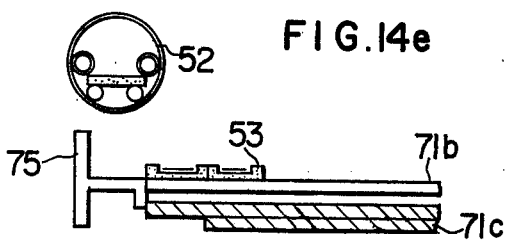

Next referring to FIG. 14(a) through 14(e), the mode of operation of the transfer device 58 will be described in detail. As shown in FIG. 14(a), three heating bases 53, each carrying a plurality of wafers 54 are on the supporting bar 71b made of P.T.F.E., when the transfer bar 71c of the oscillation type transfer device 72 driven by the motor 78 through the eccentric cam mechanism 79 is below the support bar 71b and guard bar 71a. The transfer bar 71c is moved upward by the circular motion of the eccentric cam mechanism 79 to lift up the three heating bases 53 from the support bar 71b (See FIG. 14(b)). Thereafter, the transfer bar 71c goes downwardly forward as indicated by the arrow in FIG. 8(c) and moves the heating bases a little forward, to place the first heating base on the lift 75. The first heating base 53 is then lifted up to the loading position next to the inlet end of quartz tube 52 and pushed into the quartz tube 52 by the pushing device 56. The lift 75 is returned to the initial position, when the base 53 is in the quartz tube 52 (See FIG. 14 (d) and (e).) The succeeding heating bases are fed into the quartz tube one after the other in the same way as described above. The first mechanism described above satisfies the conditions required for the successive transportation of the heating bases and has a construction to permit easy cleaning of the mechanism.

Figure 15C:
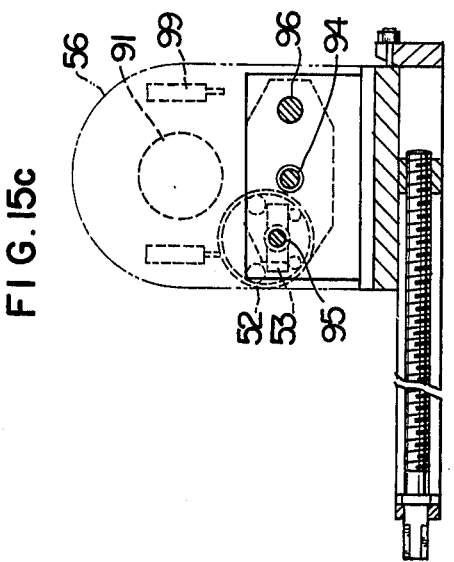
FIG. 15(c) is a sectional side view thereof, taken along the line Y—Y of FIG. 15(b)
Figure 15A:
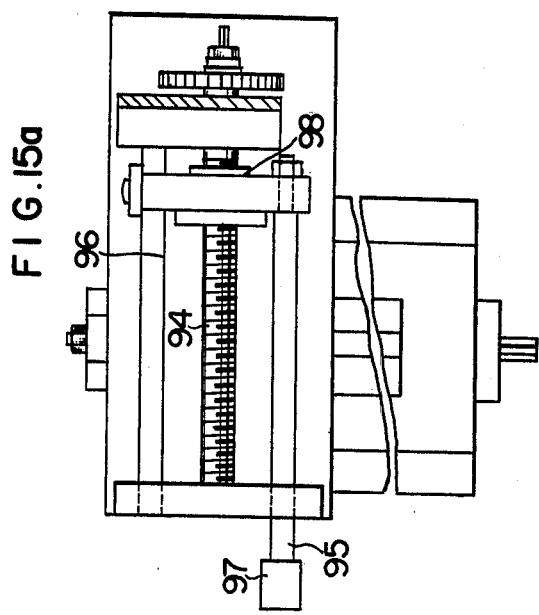
FIG. 15(a) is a sectional top view, taken along the line X—X of FIG. 15(b), of a pusher device.
Figure 15B:
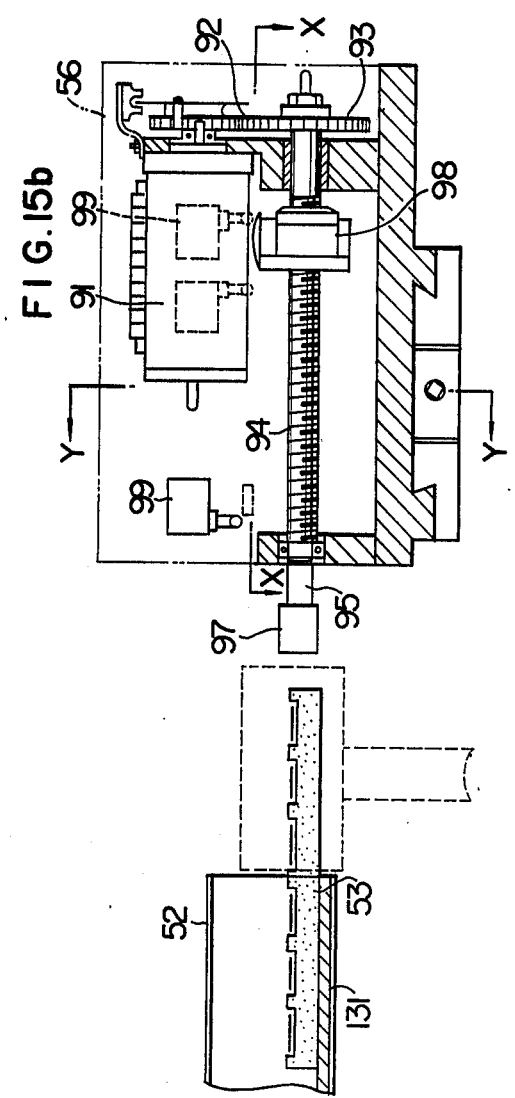
FIG. 15(b) is a sectional front view thereof.

(2) The second mechanism is adapted to transport successively a plurality of heating bases through a quartz tube surrounded with an induction heating coil from the inlet end to the outlet end of the quartz tube so that all wafers carried in the heating bases to be heated with induction heating may receive a same thermal treatment during their passage through the quartz tube for thermal diffusion. The second mechanism, therefore, is the pusher mechanism 56 shown in FIG. 15b, and this will be described in detail with reference to FIG. 15 (a) sectional top view, FIG. 15 (b) sectional front view, and FIG. 15 (c) sectional side view. In FIG. 15(b), 91 is a stepping motor; 92 and 93 are variable speed gears; 94 is a screw shaft; 95 is a pushing bar and 98 is a screw flange. The rotation of the stepping motor 91 rotates the screw shaft 94 through a pair of intermeshing gears 92 and 93. As shown in FIG. 15(a), the screw flange 98 is moved back and forth by the rotation of the screw shaft 94 and pusher 97 made of P.T.F.E. and attached to the tip of pusher bar 95 fixed to screw flange is advanced at a very slow speed by the rotation of the stepping motor 91. Advance, retreat and speed-change are controlled by electrical signals from limit switches 99 in accordance with a predetermined sequence.

Figure 16A:
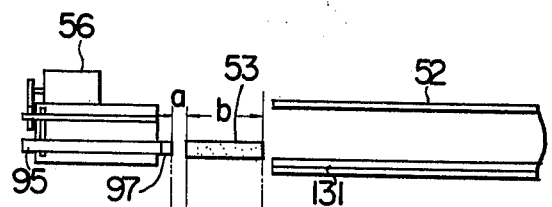
Figure 16B:
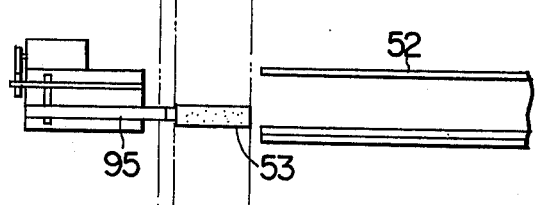
Figure 16C:
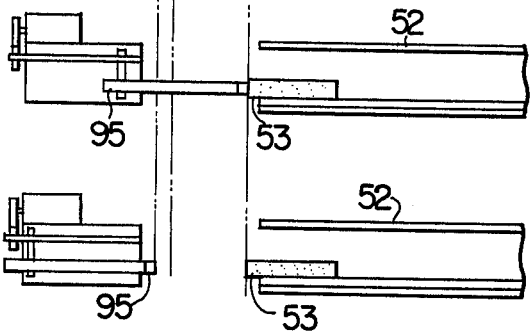
Figure 16E:
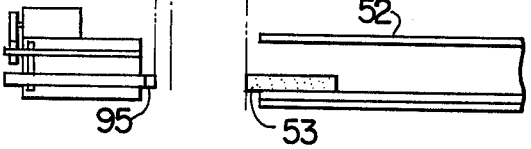
Figure 16F:
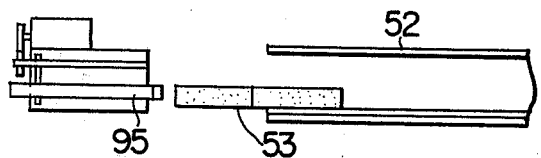
Figure 16G:
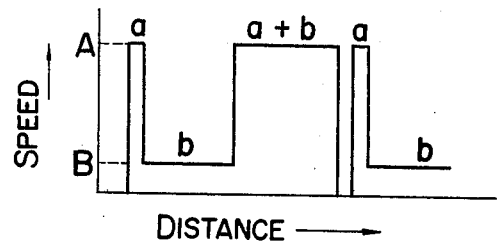
FIG. 16(g) shows a sequence of motions of the pusher device.

Next, referring to FIG. 16(a), the mode of operation of the pusher mechanism. FIG. 16(g) is a sequence chart, showing the pattern of control of pusher bar 95. As shown in FIG. 16(a), a heating base having a length b is brought to the position in front of and away, by a distance a, from pusher bar 95 by the transfer mechanism illustrated in FIGS. 13 and 14. Next, pusher bar 95 advances by a distance a at a speed A in accordance with the sequence chart (FIG. 16(g)) and then further advances, pushing the heating base 53 into quartz tube 52, by a distance a and at a low constant speed B as shown in FIG. 16(c). When the heating base 53 is pushed into the quartz tube 52 by a distance b, limit switch 99 works and sends out an electrical signal to return the pushing bar 95 by a distance a plus b and a speed A. When the second heating base 53 is brought to the loading position in the same way as described previously, it is pushed by a distance a to come in contact with the first base at this point and further pushed into the quartz tube as shown in FIG. 16(f). FIG. 16(g) is a distance vs. speed of the pusher bar 95 of the pushing device 56. Speed A is for a quick feed which in this embodiment is at the variable speed of 133-1332 mm per minute obtained from a stepping motor 91 at the speed of 100-1000 pulses per second through the intermeshing gears 92 and 93, and is used for the advance-feed by the distance a and for the return-feed by the distance a plus b. On the other hand, when the heating bases 53 are moved through the quartz tube, two different speeds are available for selection, either at the feed speed of 0.66-6.6 mm/min. or 13.3-133 mm/min. with the driving pules at the rate of 0.5-5 pulses per second and 13.3-133 pulses per second respectively.

Figure 18A:
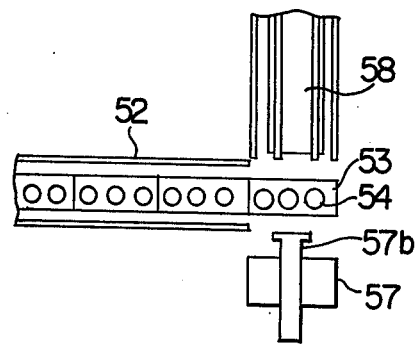
FIGS. 18(a), 18(b) and 18(c) are schematic views used for the explanation of the mode of operation of the take-out device shown in FIG. 17(a) and (b).
Figure 18B:
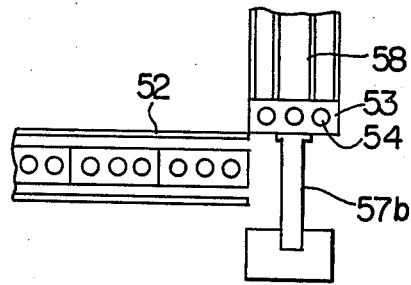
Figure 18C:
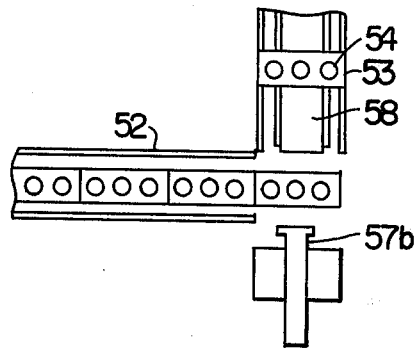
Figure 18D:
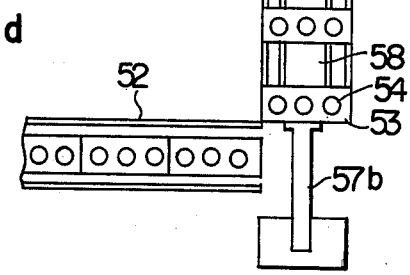

(3) The third mechanism of this invention is adapted to transport the heating bases, discharged out of the quartz tube surrounded with induction heating coil from the outlet end of the quartz tube to a predetermined place without causing any contamination or breakage of the processed wafers. FIG. 17a shows the heating base 53, the take-out device 57 and a part of transfer device 58. FIG. 17(a) is a sectional top view and FIG. 17(b) is a front view. When the heating base 53 is discharged out of the quartz tube 52 to a predetermined position, a photo-electric tube or a limit switch 80 sends out a signal in response to which air cylinder 57a is actuated to extend pushing bar 57b made of P.T.F.E. and attached to take-out device 57 so that the heating base 53 is successively transferrred to a predetermined position by the oscillation type transfer device 72, having the same construction as the one described in detail with reference to FIG. 13. The mode of operation of the mechanism will be described in detail with reference to FIGS. 18a to 18d. First the FIG. 18(a) in which the heating base 53 discharged out of the quartz tube 52 is brought to the loading position in front of the take-out device 57. Upon detection of the arrival of heating base 53 at the position, the take-out device extends its push-out bar 57b and pushes the heating base 53 into the oscillation type transfer device 58 (Refer to FIG. 18(c).). After that, the pushout bar 57b returns to the initial position (FIG. 18(c)) and pushes out the next heating base 53 in the same way as described above.

As described above, according to the present invention, a plurality of heating bases, loaded with semiconductor substrates and made of a good electrical conductor which discharges few ions at a high temperature are successively transferred through a diffusion furnace tube in which said heating bases are induction-heated by means of high frequency wave excitation so that each semiconductor substrate may receive a same thermal tratment history and the variation in characteristics of the processed semiconductor substrates may be minimized due to the fact that a continuous thermal diffusion treatment is a very high temperature atmosphere may be employed for mass production of semiconductor devices.

What is claimed is:

1. An apparatus for thermal diffusion treatment of semiconductor substrates by means of high frequency induction heating comprising;
   (a) a diffusion furnace tube having open ends and a predetermined atmosphere,
   (b) means for sealing the furnace tube from open air provided at both ends of said furnace tube,
   (c) high frequency induction heating means, including an induction heating coil provided around the outer periphery of said furnace tube,
   (d) a plurality of heating bases made of a material having a good electric conductivity which is hardly liable to discharge ions at high temperature and designed to load semiconductor substrates to be treated for thermal diffusion in said furnace tube, (e) transfer means for the successive transportation of said plurality of heating bases from the inlet opening toward the outlet opening of said furnace tube, including a means for pushing said plurality of heating bases successively one after the other from the inlet opening toward the outlet opening of said furnace tube, thereby said heating bases are subjected to induction heating with said heating means so that they receive substantially the same thermal treatment, (f) said open air sealing means including a clean chamber in which said heating base transfer means is provided being air tightly connected to one end of said furnace tube, and (g) a guide member being provided inside said furnace tube for guiding said heating bases from the inlet to the outlet of said furnace tube.

2. A diffusion apparatus as set forth in claim 1, wherein said pushing means includes:
 (a) a pushing member for pushing said heating bases in order to make them move through said furnace tube at a constant speed, and
 (b) a control device for operating said pushing member.

3. A diffusion apparatus as set forth in claim 1 wherein said heating base transfer means includes a transfer device for transporting said heating bases automatically from a predetermined position to the position which they are pushed into the inlet opening of said furnace tube.

4. A diffusion apparatus as set forth in claim 3 wherein said transfer device comprises:
 (a) a transfer member made of an acid resisting material for carrying said heating bases, and
 (b) a transfer member driving device for driving said transfer member.

5. A diffusion apparatus as set forth in claim 1 wherein the said furnace tube is disposed substantially in vertical direction, and said heating bases are pushed up successively from the inlet opening at the bottom end toward the outlet opening at the top end of said furnace tube by said pushing means.

6. A diffusion apparatus as set forth in claim 1 wherein said furnace tube is disposed substantially horizontally and said heating bases are pushed in successively from the inlet opening at one end toward the outlet opening at the other end by said pushing means.

7. A diffusion apparatus as set forth in claim 1 wherein said heating base has a holding chamber to hold said semiconductor substrates and are made up of graphite and a protective film coated film on the surface thereof for preventing oxidation.

8. An apparatus for thermal diffusion treatment of semiconductor substrates by means of a high frequency induction heating, comprising:
 (a) a diffusion furnace tube having open end for containing a predetermined atmosphere, therein,
 (b) the first and second clean chambers, purified and sealed from the open air and each airtightly connected to the respective end of said diffusion furnace tube,
 (c) high frequency induction heating means, including an induction heating coil provided around the outer periphery of said furnace tube,
 (d) a plurality of heating bases, designed to carry semiconductor substrates to be processed for thermal diffusion treatment into said furnace tube and to be subjected to induction heating by the above-said heating means in order to give a predetermined thermal treatment to said semiconductor substrates, and made of a material having good electric conductivity which is hardly liable to discharge ions at high temperature,
 (e) a guide member provided in said furnace tube for guiding said heating bases from the inlet opening toward the outlet opening of said furnace tube,
 (f) pushing means disposed in the first of said clean chambers for pushing said plurality of heating bases in contact with the adjacent heating bases one after another from the inlet opening toward the outlet opening of said furnace tube, and
 (g) take-out means disposed in said furnace tube for taking out said heating bases one after the other upon their arrival at the outlet end of said furnace tube.

9. An apparatus for thermal diffusion treatment of semiconductor substrates by means of high frequency induction heating comprising;
 (a) a diffusion furnace tube having open ends and a predetermined atmosphere,
 (b) means for sealing the furnace tube from open air provided at both ends of said furnace tube,
 (c) high frequency induction heating means, including an induction heating coil provided around the outer periphery of said furnace tube,
 (d) a plurality of heating bases made of a material having a good electric conductivity which is hardly liable to discharge ions at high temperature and designed to load semiconductor substrates to be treated for thermal diffusion in said furnace tube, and
 (e) transfer means for the successive transportation of said plurality of heating bases from the inlet opening toward the outlet opening of said furnace tube, including a means for pushing said plurality of heating bases successively one after the other from the inlet opening toward the outlet opening of said furnace tube, thereby said heating bases are subjected to induction heating with said heating means so that they receive substantially the same thermal treatment;
 said heating base transfer means including a transfer device for transporting said heating bases automatically from a predetermined position to the position which they are pushed into the inlet opening of said furnace tube.

10. A diffusion apparatus as set forth in claim 9 wherein said transfer device comprises:
 (a) a transfer member made of an acid resisting material for carrying said heating bases, and
 (b) a transfer member driving device for driving said transfer member.

11. An apparatus for thermal diffusion treatment of semiconductor substrates by means of high frequency induction heating comprising;
 (a) a diffusion furnace tube having open ends and a predetermined atmosphere,
 (b) means for sealing the furnace tube from open air provided at both ends of said furnace tube,
 (c) high frequency induction heating means, including an induction heating coil provided around the outer periphery of said furnace tube,
 (d) a plurality of heating bases made of a material having a good electric conductivity which is hardly liable to discharge ions at high temperature and designed to load semiconductor substrates to be treated for thermal diffusion in said furnace tube, and (e) transfer means for the successive transportation of said plurality of heating bases from the inlet opening toward the outlet opening of said furnace tube, including a means for pushing said plurality of heating bases successively one after the other from the inlet opening toward the outlet opening of said furnace tube, thereby said heating bases are subjected to induction heating with said heating means so that they receive substantially the same thermal treatment;

the said furnce tube being disposed substantially in vertical direction, and said heating bases being pushed up successively from the inet opening at the bottom end toward the outlet opening at the top end of said furnace tube by said pushing means.

* * * * *